United States Patent

Lee et al.

(10) Patent No.: US 6,514,862 B2
(45) Date of Patent: Feb. 4, 2003

(54) WAFER POLISHING SLURRY AND CHEMICAL MECHANICAL POLISHING (CMP) METHOD USING THE SAME

(75) Inventors: Jae-dong Lee, Seoul (KR); Jong-won Lee, Sungnam (KR); Bo-un Yoon, Seoul (KR); Sang-rok Hah, Seoul (KR)

(73) Assignee: Samsung Electronics Co. Ltd., Suwon (KR)

( * ) Notice: Subject to any disclaimer, the term of this patent is extended or adjusted under 35 U.S.C. 154(b) by 0 days.

(21) Appl. No.: 09/977,239

(22) Filed: Oct. 16, 2001

(65) Prior Publication Data

US 2002/0064955 A1 May 30, 2002

(30) Foreign Application Priority Data

Oct. 16, 2000 (KR) .............................. 00-60704

(51) Int. Cl.[7] .......................................... H01L 21/302
(52) U.S. Cl. ....................................... 438/691; 257/649
(58) Field of Search ......................... 257/760, 374, 257/396, 501, 649; 438/691, 723, 724, 743, 744, 756, 757

(56) References Cited

U.S. PATENT DOCUMENTS 4,129,457 A * 12/1978 Basi .............................. 134/2
5,139,571 A * 8/1992 Deal et al. .................... 106/3
5,704,987 A * 1/1998 Huynh et al. ................ 134/6
6,303,506 B1 * 10/2001 Nojo et al. ................. 438/692

FOREIGN PATENT DOCUMENTS

KR      1999-0077428      10/1999

* cited by examiner

Primary Examiner—David Nelms
Assistant Examiner—Quoc Hoang
(74) Attorney, Agent, or Firm—Volentine Francos, PLLC

(57) ABSTRACT

A chemical mechanical polishing slurry includes an additive of a quaternary ammonium compound having a form of $\{N—(R_1R_2R_3R_4)\}^+X^-$, in which $R_1$, $R_2$, $R_3$, and $R_4$ are radicals, and $X^-$ is an anion derivative including halogen elements. Preferably, the quaternary ammonium compound is one of $[(CH_3)_3NCH_2CH_2OH]Cl$, $[(CH_3)_3NCH_2CH_2OH]I$, $[(CH_3)_3NCH_2CH_2OH]Br$, $[(CH_3)_3NCH_2CH_2OH]CO_3$, and mixtures thereof. The slurry may further include a pH control agent formed of a base such as KOH, $NH_4OH$, and $(CH_3)_4NOH$, and an acid such as HCl, $H_2SO_4$, $H_3PO_4$, and $HNO_3$. Also, the pH control agent can include $[(CH_3)_3NCH_2CH_2OH]OH$. The slurry may further include a surfactant such as cetyldimethyl ammonium bromide, cetyldimethyl ammonium bromide, polyethylene oxide, polyethylene alcohol or polyethylene glycol.

21 Claims, 2 Drawing Sheets

WAFER POLISHING SLURRY AND CHEMICAL MECHANICAL POLISHING (CMP) METHOD USING THE SAME

BACKGROUND OF THE INVENTION

1. Field of the Invention

The present invention generally relates to semiconductor devices, and more particularly, the present invention relates to a semiconductor wafer polishing slurry and to a chemical mechanical polishing (CMP) method using such a slurry.

2. Description of the Related Art

Chemical mechanical polishing (CMP) planarization methods are widely employed in a variety of processes used to manufacture semiconductor devices. CMP can be used to planarize a single material layer, such as CMP of an interdielectric layer or metal interdielectric layer, or to polish materials having two or more layers, such as CMP in shallow trench isolation (STI) process. In the case of polishing materials having two or more layers (such a layer to be polished and a polishing stop layer), it is generally necessary that the CMP process exhibit high selectivity between the layers.

For example, when an insulating material such as a silicon dioxide layer ($SiO_2$ layer) is planarized, generally a silicon nitride layer ($Si_3N_4$ layer) is used as a polishing stop layer. When present CMP techniques are employed in which the chief ingredient of the slurry is silica, the removal selectivity of $SiO_2:Si_3N_4$ is known to be about 4:1 in a blanket wafer. This relatively low removal selectivity reduces the process margins and necessitates very fine CMP process control.

There is thus a desire for a CMP slurry that exhibits an improved removal selectivity between a layer to be polished and a silicon nitride polishing stop layer.

SUMMARY OF THE INVENTION

An objective of the present invention is to provide a CMP slurry that exhibits an improved removal selectivity between a layer to be polished and a silicon nitride polishing stop layer, and to provide a polishing method using such a slurry.

According to one aspect of the present invention, a CMP slurry includes quaternary ammonium compound which is a compound having the form of $\{N—(R_1R_2R_3R_4)\}^+X^-$, where $R_1, R_2, R_3$, and $R_4$ are radicals and $X^-$ is an anion derivative.

$R_1, R_2, R_3$, and $R_4$ of the quaternary ammonium compound can be an alkyl group or an alkanol group, and $R_1, R_2$, and $R_3$ are generally a methyl group and $R_4$ is an ethanol group. Preferably, the quaternary ammonium compound can be $[(CH_3)_3NCH_2CH_2OH]Cl$, $[(CH_3)_3NCH_2CH_2OH]l$, $[(CH_3)_3NCH_2CH_2OH]Br$, $[(CH_3)_3NCH_2CH_2OH]CO_3$, or mixtures thereof.

The slurry can further include a pH control agent formed of a base such as KOH, $NH_4OH$ or $(CH_3)_4NOH$, or an acid such as HCl, $H_2SO_4$, $H_3PO_4$ or $HNO_3$. Also, a pH control agent can include $[(CH_3)_3NCH_2CH_2OH]OH$.

The slurry can further include a surfactant such as cetyldimethyl ammonium bromide, cetyldimethyl ammonium bromide, polyethylene oxide, polyethylene alcohol, or polyethylene glycol.

According to another aspect of the present invention, a polishing method includes providing a semiconductor wafer having a silicon dioxide layer and a silicon nitride stop layer, and chemical mechanical polishing the silicon dioxide layer and the silicon nitride stop layer using above-described slurry.

BRIEF DESCRIPTION OF THE DRAWINGS

The above and other aspects and advantages of the present invention will become more readily apparent from the detailed description that follows, with reference to the accompanying drawings, in which.

DETAILED DESCRIPTION OF THE INVENTION

Hereinafter, preferred embodiments of the present invention will be described in greater detail with reference to the appended drawings. The preferred embodiments of the present invention may be modified in various ways, however, and the scope of the invention is not limited to the preferred embodiments. Rather, the preferred embodiments of the present invention are presented to explain the present invention more completely to those skilled in the art.

According to a preferred embodiment of the present invention, a slurry for polishing a wafer includes a solvent, such as deionized water, and polishing particles suspended in the solvent. The polishing particles can be formed of a metal oxide such as silica, alumina, titania, zirconia, germania, or ceria. The polishing particles comprise about 1–30 wt % of the entire slurry. Also, an additional agent such as an oxidizer can be further included in the slurry as occasion demands.

According to a preferred embodiment of the present invention, quaternary ammonium compound having a form of $\{N—(R_1R_2R_3R_4)\}^+X^-$ is added to the slurry. Here, $R_1, R_2, R_3$, and $R_4$ are radicals, for example, alkyl groups or alkanol groups, and $X^-$ is an anion derivative including halogen elements. For example, $R_1, R_2$, and $R_3$ can be methyl groups and $R_4$ can be an ethanol group.

Figure 1:
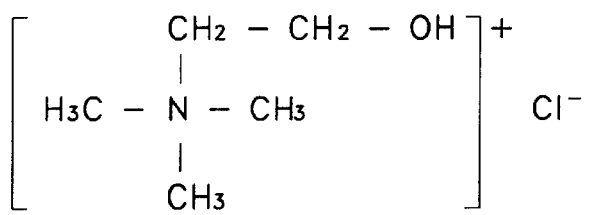
FIG. 1 is a figure illustrating $[(CH_3)_3NCH_2CH_2OH]Cl$ added to a slurry according to a preferred embodiment of the present invention.

A preferred example of the quaternary ammonium compound can be $[(CH_3)_3NCH_2CH_2OH]Cl$, $[(CH_3)_3 NCH_2CH_2OH]l$, or $[(CH_3)_3NCH_2CH_2OH]Br$, compounds can be called choline-halogen compounds, and a preferred embodiment can be $[(CH_3)_3NCH_2CH_2OH]Cl$ as shown in FIG. 1. The compounds $[(CH_3)_3NCH_2CH_2OH]l$ and $[(CH_3)_3 NCH_2CH_2OH]Br$ have a structure in which respectively, are substituted for the Cl of the choline-halogen compound shown in FIG. 1. That is, choline-derivative compounds combined with a derivative including halogens, can be preferably used as the choline-halogen compound.

Also, a choline derivative compound such as a well known $[(CH_3)_3NCH_2CH_2OH]CO_3$, can be used. The choline-derivative compound includes a choline base ($C_5H_{15}NO_2$), choline dihydrogen citrate ($C_{11}H_{21}NO_8$), choline bitartrate ($C_9H_{19}NO_7$), tricholine citrate ($C_{21}H_{47}N_3O_{10}$), choline ascorbate ($C_{11}H_{21}NO_7$), cholineborate ($C_5H_{16}BNO_4$), choline theophylinate ($C_{11}H_{21}H_6O_3$), choline gluconate ($C_{11}H_{25}NO_8$), acetylcholine chloride ($C_7H_{16}ClNO_2$), acetylcholine bromide ($C_7H_{16}BrNO_2$), or metacholine chloride ($C_8H_{16}ClNO_2$).

These choline-derivative compounds, which are preferably derivative compounds including choline-halogen elements, of about 0.1–5 wt %, can be added to the slurry, preferably in an amount of about 0.3–3 wt %. These choline-derivative compounds are added to the slurry and dissociated to form a choline cation and a derivative anion. For example, the choline chloride of FIG. 1 can form a choline cation, $[(CH_3)_3NCH_2CH_2OH]^+$ and a halogen anion $Cl^-$.

Choline cations are attracted to negative electric charge sites which exist on the surface of the silicon nitride layer, and enable a strong attraction such as a hydrogen bond, or enable static electricity between the cations and the negative electric charge sites on the surface. More particularly, structures such as $\equiv N$, $=N-H$, and $-NH_2$ can be microscopically formed on the silicon nitride layer which is formed over the semiconductor wafer, and in the base atmosphere, some $=N-H$, and $-NH_2$ groups are ionized and have a negative electric charge. This negative electric charge can form an attraction such as a hydrogen bond or static electricity with a choline cation. In fact, since a choline derivative of an ethanol group has an excellent polarity, an attraction such as a hydrogen bond or the static electricity with the sites having the negative electric charge can be effectively formed.

Accordingly, the surface of the silicon nitride layer can be passivated by the choline cation attracted by the hydrogen bond. Therefore, if CMP is performed on the surface of a silicon nitride layer using the slurry suggested in the preferred embodiments of the present invention, the silicon nitride layer is polished to a lesser extent than the silicon dioxide layer. Since the structures such as $\equiv N$, $=N-H$, and $-NH_2$ cannot be formed on the surface of the silicon dioxide layer, the removal rate of the silicon nitride layer is lower than that of the silicon dioxide layer in which the passivation does not occur. Thus, the removal selectivity of the silicon dioxide layer on the silicon nitride layer can be effectively increased.

Effects embodied by the preferred embodiments of the present invention will be described below with reference to specific examples.

EXAMPLE 1

Figure 2:
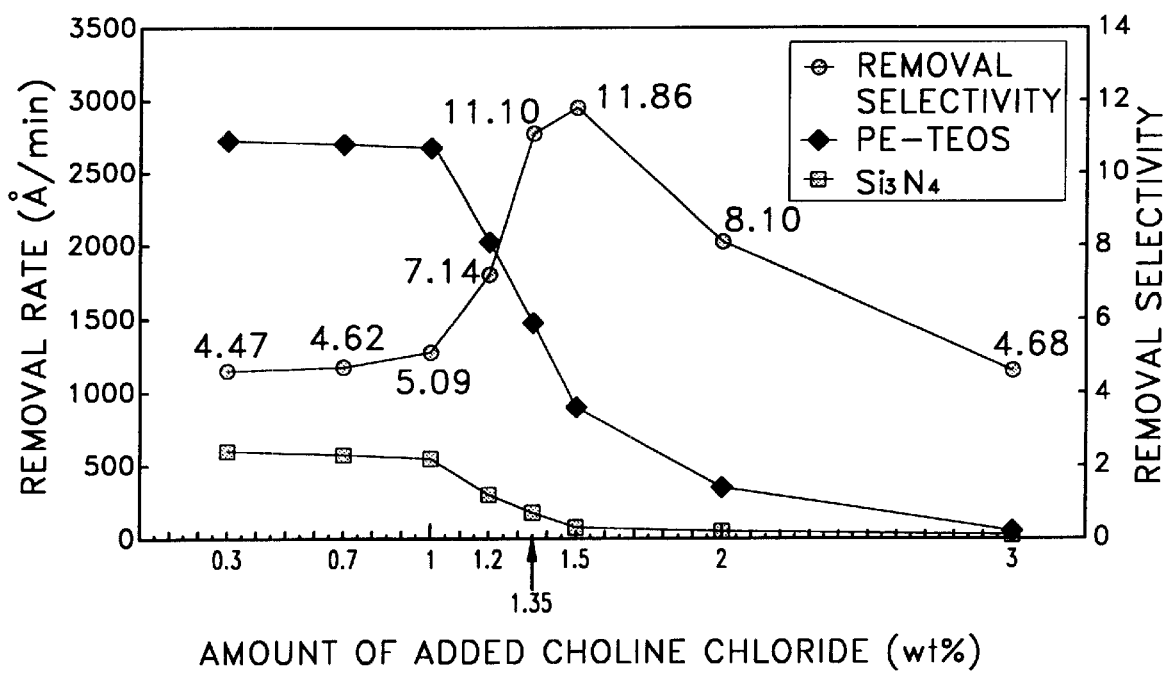
FIG. 2 is a graph illustrating the results of measurements which were performed to demonstrate the change in removal selectivity resulting from the addition of the $[(CH_3)_3NCH_2CH_2OH]Cl$ to the slurry according to a preferred embodiment of the present invention.

In the preferred embodiments of the present invention, a quaternary ammonium compound such as a choline-derivative compound is added to the slurry in which polishing particles are suspended in deionized water, so that the removal selectivity relative to the silicon nitride layer can be effectively increased. FIG. 2 illustrates the effects of adding the choline chloride of FIG. 1 to the slurry.

To obtain the illustrated measurements, a PRESI polisher was used as a chemical mechanical polishing apparatus. A down force of 6 psi and a platen rotating speed of 65 rpm were used. A slurry manufactured by diluting slurry used for the oxide with deionized water was used. In order to exclude any influence of the pH on the rate, the pH of the slurry was maintained at 11.2. For the CMP, the silicon nitride layer and the silicon dioxide layer are respectively formed on the surface of the respective wafer.

For comparison, the removal rate of the silicon dioxide layer (PE-TEOS) under the above conditions in the absence of the choline chloride was 2501 Å/min, and the removal rate of the oxide nitride layer was 588 Å/min. The removal selectivity of the silicon dioxide layer to the silicon nitride layer, calculated from these values, was 4.25. The pH of the entire slurry was maintained at 11.2 for comparison under the same conditions.

As shown in FIG. 2, in the case where the choline chloride of FIG. 1 was added to the slurry as according to the preferred embodiment of the present invention, the removal selectivity becomes almost three times higher than that of the case where the choline chloride was not added. Therefore, these results demonstrate that the removal selectivity of $SiO_2:Si_3N_4$ can be effectively improved by the preferred embodiments of the present invention, i.e, by adding the described choline-derivative compounds such as $[(CH_3)_3NCH_2CH_2OH]Cl$, $[(CH_3)_3NCH_2CH_2OH]I$, $[(CH_3)_3NCH_2CH_2OH]Br$, or $[(CH_3)_3NCH_2CH_2OH]CO_3$.

The improved removal selectivity resulting from the addition of the choline-compound to the slurry, may be due to the action of the choline cation which is dissociated in the choline-derivative compound, for example, $[(CH_3)_3NCH_2CH_2OH]^+$. However, if too large an amount of the choline-derivative compounds is added, as is apparent from FIG. 2, the removal rate of both the silicon nitride layer and the silicon dioxide layer can decrease substantially.

Thus, the amount of added choline-derivative compound which can improve the removal selectivity of the silicon dioxide layer on the silicon nitride layer is considered to be about 0.1–5.0 wt % of the slurry. From the results of the graph shown in FIG. 2, it is preferable to add the choline chloride in an amount of about 0.5–3.0 wt % of the slurry.

If the amount of the choline cation which is formed by dissociating the choline-derivative compound in the slurry is set as a standard, it is preferable to add the choline-derivative compound, for example choline chloride, to the slurry in order to make the amount of the choline cation in the slurry about 0.001–5 M, preferably 0.1–1 M.

The effect of adding the choline-derivative compound can be embodied by adding the single choline compound, for example choline chloride, as shown in FIG. 2. However, two or more kinds of choline-derivative compounds can be mixed, and the removal selectivity can be effectively improved by adding the mixture to the slurry.

EXAMPLE 2

If the pH of the slurry changes when the choline-derivative compound is added to the slurry, the removal rate of the silicon dioxide layer and the silicon nitride layer can change, which in turn can change the removal selectivity. Table 1 shows changes in the removal rate and removal selectivity caused by changing the pH of the slurry, fixing the amount of added choline chloride, and using sulfuric acid ($H_2SO_4$) and potassium hydroxide (KOH). The amount of added choline chloride is arbitrarily fixed at 1.39 wt % in which the choline cation has a molar concentration (M) of 0.1 in an aqueous solution.

TABLE 1

| pH | PE-TEOS (Å/min) | $Si_3N_4$ (Å/min) | Removal selectivity |
| --- | --- | --- | --- |
| 11.2 | 1736 | 177 | 9.81 |
| 12.45 | 2912 | 433 | 6.73 |
| 12.9 | 3089 | 407 | 7.59 |

As shown in Table 1, variation of the pH can alter the removal rate and the removal selectivity of the silicon dioxide layer and the silicon nitride layer. In particular, when the pH increases, the removal rate of the silicon dioxide layer increases. This is because the hydration rate of the silicon dioxide layer increases when there is a high pH, so that the removal rate of the silicon dioxide layer can increase. Therefore, the increase in the hydration rate can compensate for the decrease in the removal rate of the silicon dioxide layer resulting from the addition of the choline chloride.

As suggested in Table 1, when the choline chloride is added, it is preferable that the slurry has a pH of about 9–13.5. In order to increase the removal rate of the silicon dioxide layer, it is preferable that the slurry has a pH of about 12.

The control of the pH of the slurry can be accomplished by adding extra pH control agent. The choline-halogen compounds suggested in the present invention such as choline chloride do not substantially change the overall pH even though they are added to the slurry and dissociated in aqueous solution. Therefore, it is preferable to control the pH by adding an extra pH control agent.

A base or an acid can be used as the pH control agent. Bases include potassium hydroxide (KOH), ammonium hydroxide ($NH_4OH$) or tetramethyl ammonium hydroxide (TMAH: $(CH_3)_4NOH$). Also, choline hydroxide ($[(CH_3)_3NCH_2CH_2OH]OH$) can be used as the base. Acids include hydrochloric acid (HCl), sulfuric acid ($H_2SO_4$), phosphoric acid ($H_3PO_4$) or nitric acid (HNO3). The pH of the slurry can be maintained at a certain level by adding the acid and the base to the slurry.

Figure 3:
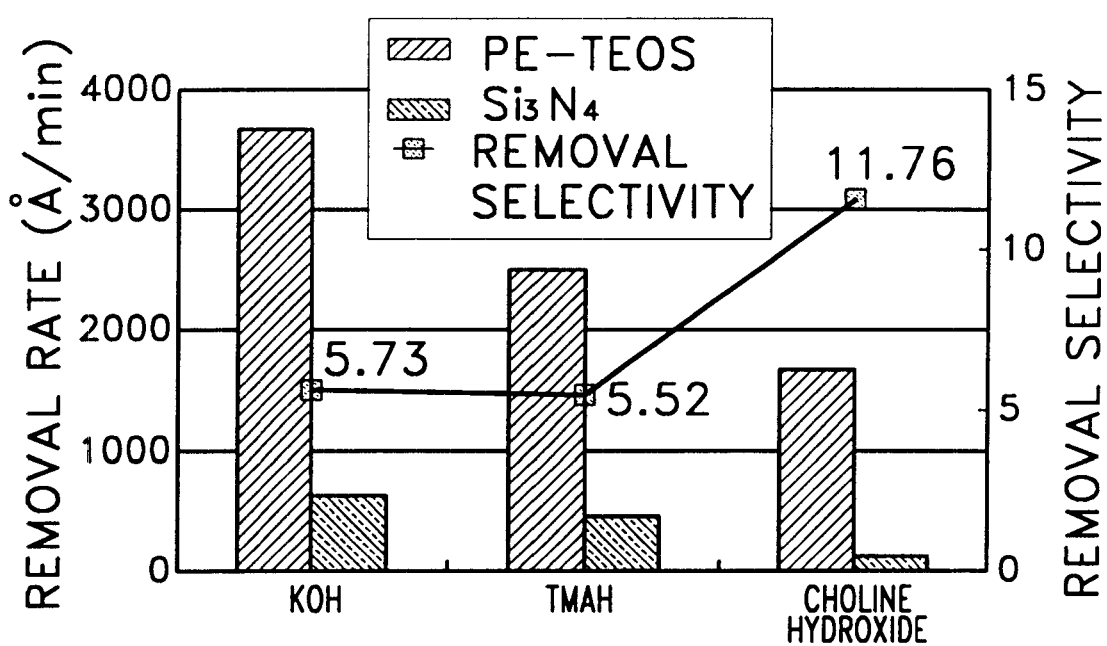
FIG. 3 is a graph illustrating the results of measurements which were performed to demonstrate the change in removal selectivity resulting from the addition of a pH control agent to the slurry according to a preferred embodiment of the present invention.

Even though the pH of the slurry is maintained to be constant, the removal selectivity of the silicon dioxide layer on the silicon nitride layer can change according to the kind of pH control agent used. This is illustrated in the graph of FIG. 3. In particular, FIG. 3 shows the results of measuring the removal selectivity upon adding KOH, TMAH and choline hydroxide, respectively, as the base among the pH control agents to the slurry including choline chloride. Here, the pH of the slurry is set to be 12.5, and the sulfuric acid is used as the acid.

According to the results illustrated in FIG. 3, the difference between the removal selectivity when using TMAH and that when using KOH is not so large. However, when using KOH, the removal selectivity of the individual layer materials increases compared to the case of using TMAH. When using the choline hydroxide as the base, however, a relatively high removal selectivity can be obtained.

EXAMPLE 3

The amount of pH control agent, that is, choline hydroxide, added to the slurry can impact the removal selectivity.

Table 2 shows the change in removal selectivity according to the amount of choline hydroxide added as the base among the pH control agents. In particular, the change of the removal selectivity with respect to different choline chloride to choline hydroxide ratios, was measured, and is illustrated in Table 2. To make the total amount of choline cations in the slurry regular, that is, to fix the concentration of choline cations at 0.1 M, the relative amounts of the choline chloride and the choline hydroxide are changed.

TABLE 2

| Mol Rate of Choline Chloride:Choline Hydroxide | PE-TEOS (Å/min) | $Si_3N_4$ (Å/min) | Removal selectivity |
|---|---|---|---|
| 1.0:0.0 | 1736 | 177 | 9.81 |
| 0.75:0.25 | 1860 | 164 | 11.3 |

TABLE 2-continued

| Mol Rate of Choline Chloride:Choline Hydroxide | PE-TEOS (Å/min) | $Si_3N_4$ (Å/min) | Removal selectivity |
|---|---|---|---|
| 0.5:0.5 | 1457 | 104 | 14.0 |
| 0.25:0.75 | 1055 | 72 | 14.7 |

The result of Table 2 shows that when the amount of added choline hydroxide increases, although the overall amount of choline cations within the slurry is fixed, the removal selectivity can be increased. The increase in the amount of added choline hydroxide causes an increase in the relative amount of $OH^-$ ions within the slurry, so that the pH of the slurry increases. That is, as the pH increases, the removal selectivity also increases.

When the choline hydroxide is added to the slurry including the choline-derivative compounds as the pH control agent, the amount of added choline-halogen compound is, preferably, controlled to make the concentration of the entire choline cations within the slurry about 0.001–5 M, more preferably, 0.1–1 M.

EXAMPLE 4

As suggested in a preferred embodiment of the present invention, the removal selectivity of the silicon dioxide layer on the silicon nitride layer can be improved by adding a surfactant to the slurry. This improvement effect can be demonstrated by the results of Table 3 which shows the changes in the polishing removal selectivity according to the addition of the polyethylene oxide. In particlar, the results of adding 1.3% by weight choline chloride and 0.05% by weight polyethylene oxide (PEO) as the surfactant are tablated in Table 3. The pH of the slurry is maintained at 11.2.

TABLE 3

| Amount of Choline Chloride: Polyethylene Oxide | PE-TEOS (Å/min) | $Si_3N_4$ (Å/min) | Removal selectivity |
|---|---|---|---|
| 1.3 wt %; 0.0 wt % | 2070 | 399 | 5.2 |
| 1.3 wt %; 0.05 wt % | 2288 | 283 | 8.1 |

As suggested in Table 3, the removal selectivity of the silicon dioxide layer on the silicon nitride layer can be improved by adding the PEO with the choline chloride to the slurry. A low molecular surfactant or a polymer surfactant can be used as the surfactant. The surfactant includes a cation surfactant such as cetyldimethyl ammonium bromide or cetyltrimethyl ammonium bromide, and a deionized surfactant such as a well-known brand name, "Brij™" or "Tween™". Also, a high molecular surfactant such as a well-known brand name "Pluronic™", PEO, polyvinyl alcohol (PVA) or polyethylene glycol (PEG) can be included. Preferably, the amount of surfactant added to the slurry is about 0.001–1 wt % based on the weight of the slurry.

According to the preferred embodiments of the present invention, the slurry can be used in polishing a wafer surface having a silicon dioxide layer and silicon nitride layer. Here, the silicon dioxide layer can be formed to fill an STI structure, and the silicon dioxide layer can be patterned by polishing the silicon dioxide layer using the silicon nitride layer formed in the lower portion of the silicon dioxide layer as a polishing stop layer.

The removal selectivity of the silicon dioxide layer on the silicon nitride layer can be improved by performing the CMP process using the slurry according to the preferred embodiments of the present invention. Therefore, it becomes easier to control the CMP process, and the process margin can be enhanced.

The present invention has been described in detail through the preferred embodiments thereof. However, the present invention may be changed or improved by those skilled in the art without departing from the spirit and scope of the invention.

What is claimed is:

1. A wafer polishing slurry, comprising:

a plurality of polishing particles;

a solvent in which the polishing particles are suspended; and a quaternary ammonium compound contained in the solvent and having a form of $\{N-(R_1R_2R_3R4)\}^+X^-$, in which $R_1$, $R_2$, $R_3$ and $R_4$ are radicals and $X^-$ is an anion derivative; and wherein the quaternary ammonium compound comprises $[(CH_3)_3NCH_2CH_2OH]Cl$, $[(CH_3)_3NCH_2CH_2OH]I$, $[(CH_3)_3NCH_2CH_2OH]Br$, $[(CH_3)_3NCH_2CH_2OH]CO_3$, or mixtures thereof.

2. The wafer polishing slurry of claim 1, wherein the plurality of polishing particles are selected from the group consisting of silica, alumina, titania, zirconia, germania, ceria, and mixtures thereof.

3. The wafer polishing slurry of claim 1, wherein an amount of the polishing particles is about 1–30 wt % based on the weight of the slurry.

4. The wafer polishing slurry of claim 1, wherein the solvent comprises deionized water.

5. The wafer polishing slurry of claim 1, wherein the quaternary ammonium compound comprises $[(CH_3)_3NCH_2CH_2OH]Cl$.

6. The wafer polishing slurry of claim 1, wherein an amount of quaternary ammonium compound is about 0.1–5 wt % based on the weight of the slurry.

7. The wafer polishing slurry of claim 1, wherein an amount of quaternary ammonium compound is about 0.5–3 wt % based on the weight of the slurry.

8. The wafer polishing slurry of claim 1, wherein the quaternary ammonium compound is dissociated in the solvent, and provides a $\{N-(R_1R_2R_3R_4)\}^+$cation concentration of about 0.001–5 M.

9. The wafer polishing slurry of claim 1, wherein the quaternary ammonium compound is dissociated in the solvent, and provides a $\{N-(R_1R_2R_3R_4)\}^+$cation concentration of about 0.01–3 M.

10. The wafer polishing slurry of claim 1, wherein the slurry has a pH value of 9.0–13.5.

11. The wafer polishing slurry of claim 1, further comprising a pH control agent.

12. The wafer polishing slurry of claim 11, wherein the pH control agent comprises a base selected from the group consisting of KOH, $NH_4OH$, and $(CH_3)_4NOH$; and an acid selected from the group consisting of HCl, $H_2SO_4$, $H_3PO_4$, and $HNO_3$.

13. The wafer polishing slurry of claim 11, wherein the pH control agent comprises $[(CH_3)_3NCH_2CH_2OH]OH$.

14. The wafer polishing slurry of claim 11, further comprising a surfactant.

15. The wafer polishing slurry of claim 14, wherein the surfactant is cetyldimethyl ammonium bromide, cetyltrimethyl ammonium bromide, polyethylene oxide, polyethylene alcohol or polyethylene glycol.

16. The wafer polishing slurry of claim 14, wherein an amount of surfactant is 0.001–1 wt % based on the weight of the slurry.

17. A wafer polishing slurry, comprising:

a plurality of polishing particles;

a solvent in which the polishing particles are suspended;

a quaternary ammonium compound contained in the solvent and having a form of $\{N-(R_1R_2R_3R_4)\}^+X^-$, in which $R_1$, $R_2$, $R_3$, and $R_4$ are radicals, and the $X^-$ is an anion derivative; and a surfactant which is added to the solution; and wherein the quaternary ammonium compound comprises $[(CH_3)_3NCH_2CH_2OH]Cl$, $[(CH_3)_3NCH_2CH_2OH]I$, $[(CH_3)_3NCH_2CH_2OH]Br$, $[(CH_3)_3NCH_2CH_2OH]CO_3$, or mixtures thereof.

18. The wafer polishing slurry of claim 17, wherein the surfactant is cetyldimethyl ammonium bromide, cetyltrimethyl ammonium bromide, polyethylene oxide, polyethylene alcohol or polyethylene glycol.

19. A wafer polishing method comprising:

providing a semiconductor wafer having a silicon oxide layer and a silicon nitride stop layer; and chemical mechanical polishing the silicon oxide layer and the silicon nitride stop layer using a polishing slurry which comprises an additive of a quaternary ammonium compound having a form of $\{N-(R_1R_2R_3R_4)\}^+X^-$, in which $R_1$, $R_2$, $R_3$, and $R_4$ are radicals, and $X^-$ is an anion derivative; and wherein the quaternary ammonium compound comprises $[(CH_3)_3NCH_2CH_2OH]Cl$, $[(CH_3)_3NCH_2CH_2OH]I$, $[(CH_3)_3NCH_2CH_2OH]Br$, $[(CH_3)_3NCH_2CH_2OH]CO_3$, or mixtures thereof.

20. The method of claim 14, wherein the slurry further comprises a surfactant.

21. The method of claim 20, wherein the surfactant is cetyldimethyl ammonium bromide, cetyltrimethyl ammonium bromide, polyethylene oxide, polyethylene alcohol or polyethylene glycol.

* * * * *